(12) United States Patent  (10) Patent No.: US 7,738,311 B2
Youn et al.  (45) Date of Patent: Jun. 15, 2010

(54) SEMICONDUCTOR MEMORY DEVICES HAVING OPTIMIZED MEMORY BLOCK ORGANIZATION AND DATA LINE ROUTING FOR REDUCING CHIP SIZE AND INCREASING SPEED

(75) Inventors: Jae-Youn Youn, Seoul (KR); Sang-Jae Rehh, Seongnam-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 268 days.

(21) Appl. No.: 11/935,869

(22) Filed: Nov. 6, 2007

(65) Prior Publication Data

US 2008/0112251 A1 May 15, 2008

(30) Foreign Application Priority Data

Nov. 10, 2006 (KR) ...................... 10-2006-0110884

(51) Int. Cl.
*G11C 7/00* (2006.01)
(52) U.S. Cl. ............................ 365/230.03; 365/185.11; 365/63

(58) Field of Classification Search ............ 365/230.03, 365/185.11, 63
See application file for complete search history.

(56) References Cited

U.S. PATENT DOCUMENTS

| 5,812,473 | A | 9/1998 | Tsai |
| 5,949,732 | A | 9/1999 | Kirihata |
| 6,285,611 | B1 | 9/2001 | Kang |
| 7,106,612 | B2 * | 9/2006 | Kim ............................ 365/63 |
| 2002/0015350 | A1 * | 2/2002 | Tomishima et al. .... 365/230.03 |
| 2006/0117155 | A1 * | 6/2006 | Ware et al. .................. 711/163 |

OTHER PUBLICATIONS

Yamauchi, Tadaaki, Lance Hammond and Kunle Olukotun, "The Hierarachical Multi-Bank DRAM: A High-Performance Architecture for Memory Integrated with Processors", ULSI Laboratory, Mitsubishi Electric Corporation; Computer System Laboratory, Stanford University.

* cited by examiner

*Primary Examiner*—Son Dinh
(74) *Attorney, Agent, or Firm*—F. Chau & Associates, LLC

(57) ABSTRACT

Multi-bank semiconductor memory devices are provided having optimized memory block layouts and data line routing to enable chip size reduction and increase operating memory access speed.

17 Claims, 14 Drawing Sheets

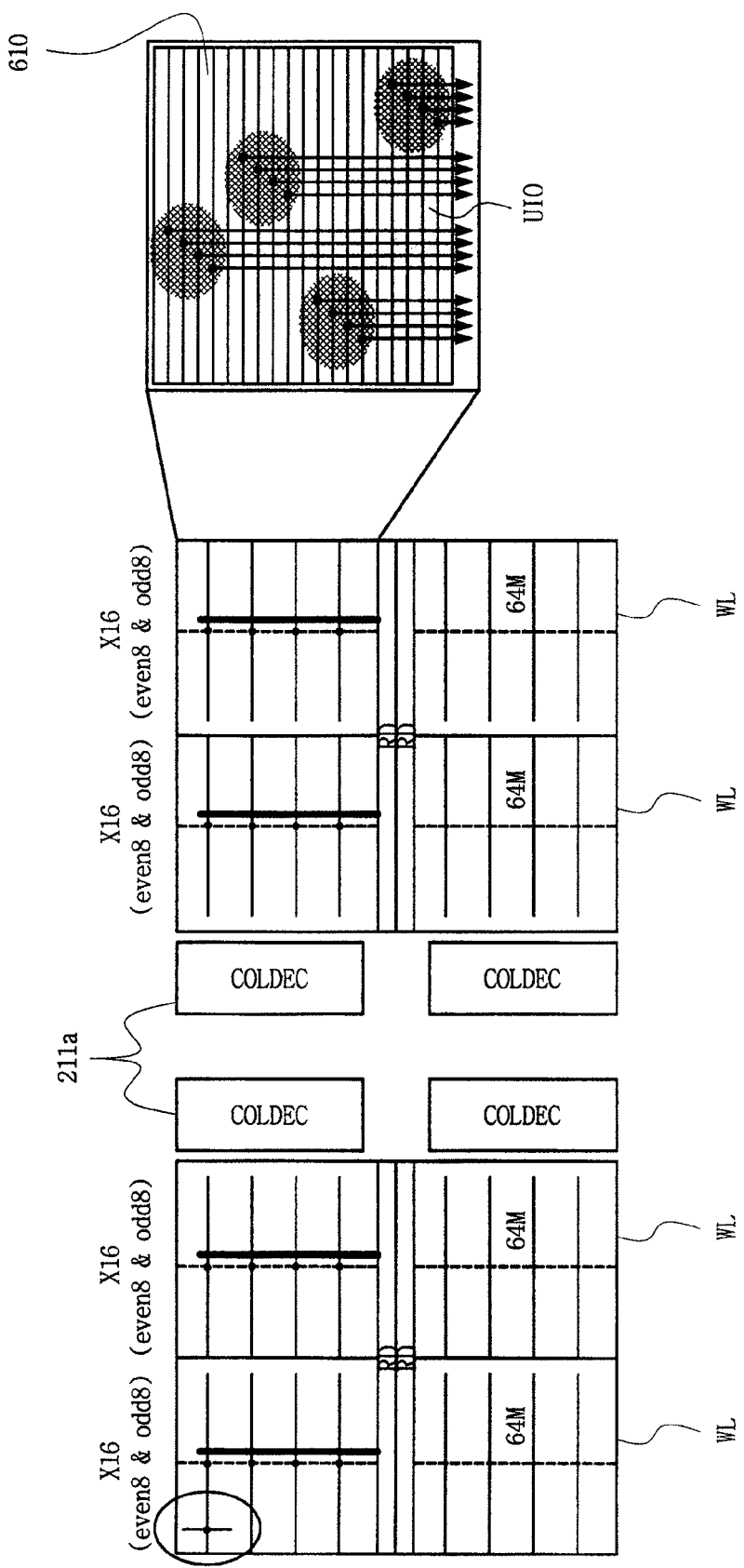

SEMICONDUCTOR MEMORY DEVICES HAVING OPTIMIZED MEMORY BLOCK ORGANIZATION AND DATA LINE ROUTING FOR REDUCING CHIP SIZE AND INCREASING SPEED

CROSS-REFERENCE TO RELATED APPLICATION

This application claims priority to Korean Patent Application No. 2006-0110884, filed on Nov. 10, 2006, which is incorporated herein by reference.

TECHNICAL FIELD OF THE INVENTION

The present invention relates generally to multi-bank semiconductor memory devices and in particular, semiconductor memory devices having optimized memory block layouts and data line routing to enable chip size reduction and increase operating memory access speed.

BACKGROUND

Technological innovations in semiconductor fabrication technologies are driving market demands for semiconductor memory devices providing higher storage capacity, higher speed, higher integration density, and lower power consumption. The downscaling of semiconductor memory devices to submicron design rules and beyond, however, coupled with increased storage capacity poses technological challenges with respect to maintaining performance and reliability. For instance, as memory capacity increases and the pitch between adjacent patterns are made narrower, the layout of the memory arrays and peripheral devices become more problematic, especially with regard to memory core layout. When designing memory circuits, it is desirable to minimize the length and loading of word lines. Indeed, if word lines are too long/narrow and/or have too many memory cells connected to each word line (i.e., a large load), word line enable driver circuits will consume more power to drive the word lines, and the speed of driving word lines can decrease. To mitigate the impact on device performance with line rule downscaling and increased memory density, various memory circuit architectures have been employed including, for example, hierarchical memory bank architectures and hierarchical word line driver structures with sub word line architectures.

For instance, FIGS. 1A~1C are schematic illustrations of a semiconductor memory device having a conventional hierarchical memory bank architectures and hierarchical word line driver framework. FIG. 1A illustrates a semiconductor integrated circuit memory chip (10) having a memory cell array with a memory capacity of 1 Gb, which is divided into a plurality of memory banks, Bank A, B, C and D (or more generally, Bank-i) (e.g., 4 memory banks of 256 Mb). Each memory bank Bank-i can be independently operated with associated peripheral circuits including column decoders (11) and row decoders (12), as well as other I/O circuitry for outputting/inputting data via peripheral data I/O pads (13). Each memory bank Bank-i comprises decoder circuits and core circuits that are arranged in "unit blocks," as depicted in FIG. 1B. In particular, FIG. 1B schematically illustrates a conventional layout of each memory bank (Bank_i) in FIG. 1A, wherein each memory bank (Bank-i) comprises a plurality of 256 unit blocks BL(i) including 16 unit blocks along an x-direction (bitline/column direction) and 16 unit blocks along a y-direction (word line/row direction).

FIG. 1C schematically illustrates a conventional layout pattern for each unit block BL-i in the memory bank Bank-i for a memory device utilizing a hierarchical sub-word line driver scheme. Each unit block BL-i includes a cell array (20), sub-word line driver (SWD) arrays (21), bit line sense amplifier (BSLA) arrays (23) and conjunction circuit blocks including PXiD driver blocks (22) and LA driver (LADRV) blocks (24). The unit block pattern BL-i depicted in FIG. 1C is repeated in both x and y directions over the memory bank Bank-i such that each memory cell array block (20) is disposed between two BLSA blocks (23) in the x (column) direction of bit lines and such that each memory cell array block (20) is disposed between two sub-word line drivers (21) in the y (word line) direction. In one conventional hierarchical word line framework, each block sense amplifier (23) is shared by two memory cell array blocks (20) to the left and right of the BLSA (23) and each sub-word line driver (21) is shared by two memory cell array blocks (20) above and below the SWD block (21) using an interleaved layout framework, as is known in the art.

By way of specific example, FIG. 2 is a schematic illustration of one conventional framework of a unit block BL-i such as depicted in FIG. 1C in a semiconductor device having a hierarchical divided word line scheme. As shown in FIG. 2, a memory cell array (20) includes an array of memory cells MC (each having a cell transistor and cell capacitor in a DRAM memory) located at the intersection of a bit line BL or BLB and a sub-word line WL. The bit lines are connected to the memory cells MC and to corresponding sense amplifiers SA in BLSA blocks (23) using an open bitline architecture, for example, as is known in the art. The BSLA blocks (23) are driven by control signals generated by drivers in respective LADRV blocks (24). In the hierarchical divided word line scheme, a word line is divided into a plurality of sub-word lines WL that are driven using corresponding sub-word line driver blocks (21) located above and below the memory cell array (20).

FIGS. 3, 4 and 5 are schematic diagrams to illustrate a conventional I/O architecture of for a multi-bank semiconductor memory device. In general, FIG. 3 is a schematic block diagram illustrating I/O circuitry for data read/write data paths for a conventional DRAM core comprising a plurality of banks. FIG. 4 schematically illustrates a layout arrangement of local and global data I/O bus lines providing a core data path from the memory cells and global bus lines for a multi-bank semiconductor device. FIG. 5 schematically illustrates a layout of the I/O circuitry and bus lines within the memory cell array regions and in peripheral regions of the memory arrays. FIGS. 3, 4, and 5 illustrate a typical device having an open bit line structure where bit lines BL and inverted bit lines BLB extend to both sides of a sense amplifier (23i) and where memory cells (MC) are formed at intersection region of the bit lines and word lines. Bit line pairs BL, BLB are respectively placed at both sides of each sense amplifier (23i) in a given array.

As shown in FIG. 3, each sense amplifier (23i) is shared by two memory cell arrays and is connected to local data lines LIO and /LIO by pass gates M1, M2 which are gated by the column select line CSL. As explained below, each column select line (CSL) may control multiple sense amplifiers per sense amplifier array, where each sense amplifier serves one data line pair. An LGIO multiplexer circuit (30) connects local data I/O line pairs LIO, /LIO to global data I/O line pairs GIO, /GIO. A GIO multiplexer circuit (31) connects the global data I/O line pars GIO, /GIO to data I/O line pairs DIO, /DIO at the input to a data read path and at the output of a data write path. The data read path includes IO sense amplifiers (32), a data bus multiplexer (33) and data output buffer (34) to output data to the appropriate output pads 13 upon memory read access operations. The data write path receives data input via the pads (13) at a data input buffer (35), a multiplexer circuit (36) and a data driver (37) to drive respective DIO line pairs.

To read out one or a plurality of data from the memory cells of the semiconductor memory device, the data stored in the cells are amplified in the bitline sense amplifier (23i). The data amplified in the bitline sense amplifier (23i) are transferred to the local data I/O lines LIO and /LIO) via a column selection line (CSL) switch, amplified in an LIO sense amplifier connected to the LIO bus, and then transferred to the global I/O buss. Data read from a selected memory block is transmitted to data line pairs DIO, /DIO via the GIO multiplexer (31). Data line sense amplifiers (32) sense data transferred via the data lines DIO and /DIO. The data line multiplexer (33) selects from among the output signals of the data line sense amplifiers (32), and transmits the selected output data signals to pads (13) via the data output buffer (34).

FIG. 4 schematically illustrates a layout structure of data lines from a memory cell to global I/O lines. As shown in FIG. 4, the semiconductor memory device includes alternating odd and even numbered memory cell blocks (101, 102, 103) with array of sense amplifiers interposed between the arrays. The LIO bus lines include two pairs (110) and (111) local I/O lines LIO, LIOB that extends over the sense amplifiers (i.e., parallel to the word lines) between the arrays and service the bit line sense amplifiers located within an array. The global I/O lines extend parallel to the bit lines over the full length of the memory array. The LIO bus lines may be formed from a first metallization level whereas the GIO bus lines are formed using a second metallization level. In the exemplary embodiment of FIG. 4, each CSL (column select line) is connected to the column switch circuit for 2 sense amplifiers on each side of the cell arrays and one CSL signal output form a column decoder (13) will activate the two pairs of sense amplifiers on each side of the cell arrays. This allows for DDR (dual data rate) memory access operations where 4 sets of LIO data can be transferred to the GIO lines for each CSL activation.

FIG. 5A illustrates an exemplary layout of the I/O circuitry and bus lines. As shown, the GIO bus lines extends over the entire memory bank towards a peripheral regions between the column decoders (130) of adjacent memory banks. The peripheral regions includes the GIO multiplexer circuit (31), the I/O sense amplifier circuit (32) and the DB multiplexer circuitry. Moreover, data I/O bus lines DIOB extend over substantially the entire length of the peripheral region between the top and bottom side of the memory banks and then extend across the top regions of the memory banks towards DOUT buffers and the DQ pads disposed at the peripheral edge regions of the semiconductor memory chip. Due to long lengths, repeater circuit (40) may be included along the DOIB bus lines. The repeaters (40) operate to buffer and transmit data on the DOIB lines between data pad and the DB multiplexer circuit (33) and thereby reduces the load and decreases the delay of the data signals of the DOIB lines.

When current sensing is used on the data lines, the transmission distances from the memory blocks to the data line sense amplifier vary. Accordingly, current from a memory block close to the data line sense amplifier travels a shorter length of the data lines and experiences less resistance on the data lines between the memory block and the data lines sense amplifier. Current from a memory block far away from the data line sense amplifier experiences more resistance on the data lines between that memory block and the data lines sense amplifier. Accordingly, the data line sense amplifier often has different sensing efficiency for different memory blocks. For instance, as shown in FIG. 5B, memory access operation to the upper left side of the memory bank (e.g., BANK A) must travel a long path along the GIO lines toward the column decoder (13) for the bank, and then up and down the FDIO and DOIB bus lines in the peripheral regions and then back towards the output pads over the top side of the memory bank A from between the column decoders (130). This can lead to differences in access times for read operations, which is particularly undesirable for a memory device such as a synchronous DRAM (SDRAM) where timing of data signals is critical. The problem becomes more significant for larger capacity memories because the relative differences in transmission lengths typically increase with an increase in the memory capacity and the integration density. Accordingly, a need exists for a semiconductor memory device capable of keeping the sensing efficiency of a data line sense amplifier uniform.

SUMMARY OF THE INVENTION

Exemplary embodiments of the invention generally include multi-bank semiconductor memory devices having optimized memory block layouts and data line routing to enable chip size reduction and increase operating memory access speed.

In one exemplary embodiment of the invention, a semiconductor memory device includes a memory array with a plurality of memory banks divided into a plurality of sub-banks. A first set of data I/O lines extend in a first direction between sub-banks, wherein the first set of data I/O lines are formed in a first metallization level. A second set of data I/O lines extend in a second direction, perpendicular to the first direction, across one sub-bank, wherein the second set of data I/O lines are formed in a second metallization level and connected to the first set of data I/O lines. A third set of data I/O lines extend in the first direction across the one sub-bank, wherein the third set of data I/O lines are formed in a third metallization level and connected to the second set of data I/O lines. The groups of data I/O lines are connected to I/O sense amplifiers disposed in regions of the memory array between adjacent banks.

In another embodiment, each subbank of a given memory Bank is arranged along a row in the first direction. Two banks have rows of subbanks that are adjacent to each other with word line decode circuitry interposed there between where two subbanks of a given bank may share a same column decoder for the bank.

The third set of data I/O lines are connected to I/O circuitry disposed in a central region between adjacent pairs of memory banks. A fourth set of data I/O lines connected to the I/O circuitry and extending in the first direction between the central region across one or more sub-banks toward a peripheral edge region and connected to I/O pads disposed on the peripheral edge region. The fourth set of data I/O lines are formed in the third metallization level.

These and other exemplary embodiments, aspects, and features of the present invention will become apparent from the following detailed description of exemplary embodiments, which is to be read in connection with the accompanying drawings.

BRIEF DESCRIPTION OF THE DRAWINGS

FIG. 11 schematically illustrates an memory access operation in a multibank semiconductor device according to an exemplary embodiment of the invention.

DETAILED DESCRIPTION OF EXEMPLARY EMBODIMENTS

Figure 1A:
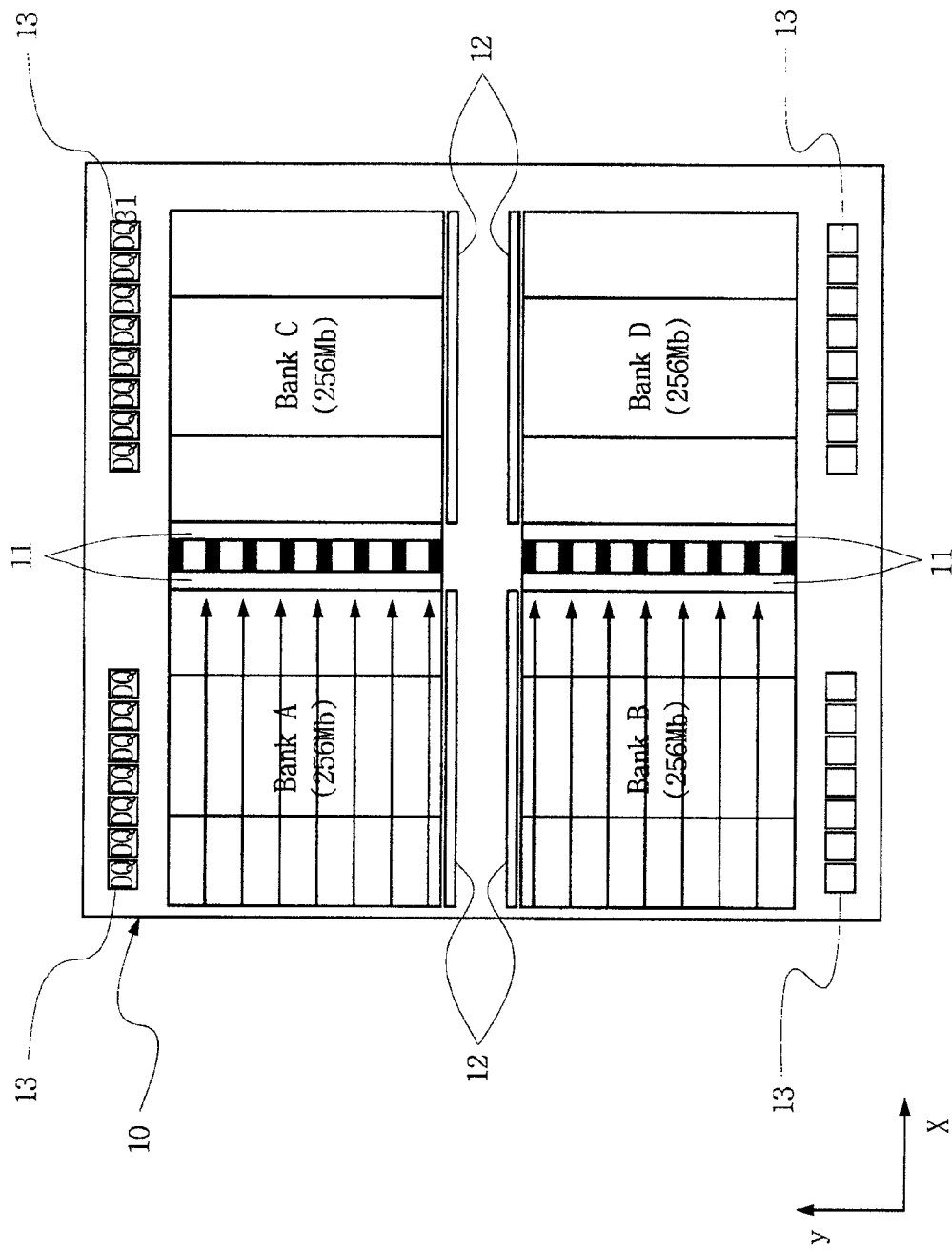
FIGS. 1A~1C are schematic illustrations of a semiconductor memory device having a conventional hierarchical memory bank architectures and hierarchical word line driver framework.

Exemplary embodiments of the invention will now be described more fully with reference to the accompanying drawings in which it is to be understood that the thickness and dimensions of the layers and regions are exaggerated for clarity. It is to be further understood that when a layer is described as being "on" or "over" another layer or substrate, such layer may be directly on the other layer or substrate, or intervening layers may also be present. Moreover, similar reference numerals used throughout the drawings denote elements having the same or similar functions.

Figure 6:
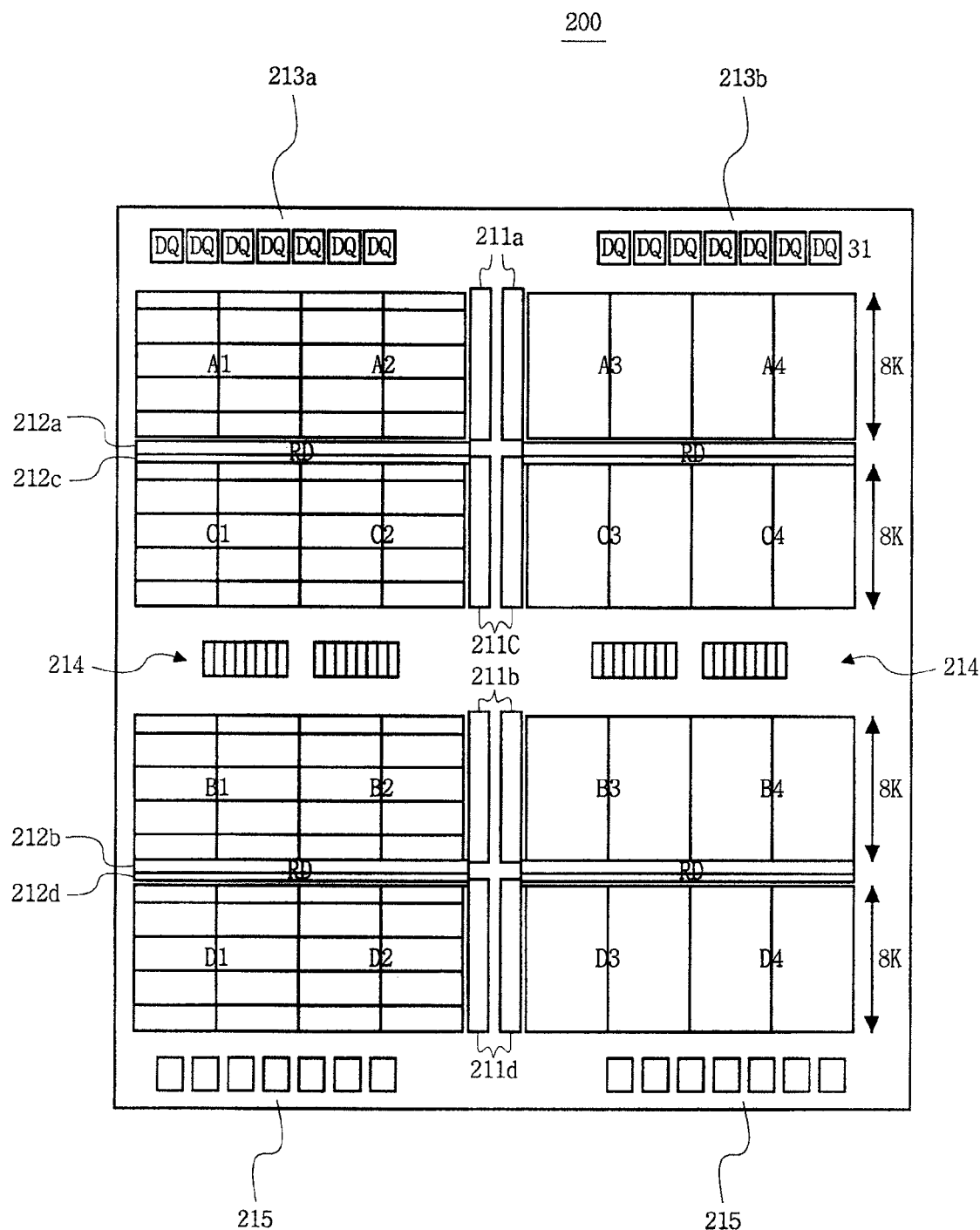
FIG. 6 is a block diagram of a multi-bank semiconductor memory device according to an exemplary embodiment of the invention

FIG. 6 is a block diagram of a multi-bank semiconductor memory device according to an exemplary embodiment of the invention. FIG. 6 is an exemplary embodiment of a multi-bank semiconductor memory device in which memory banks are divided into subbanks to achieve a more uniform layout for data path lengths as well as the use of additional I/O bus formed on the cell arrays utilizing an existing metal layer to shorten the data path, which reduces the differences in access times for read operations, for a memory device such as a synchronous DRAM (SDRAM) where timing of data signals is critical. FIG. 6 illustrates a semiconductor integrated circuit memory chip (200) having a memory cell array with a memory capacity of 1 Gb, which is divided into a plurality of memory banks, Bank A, B, C and D (e.g., 4 memory banks of 256 Mb), a plurality of column decoders 211a, 211b, 211c and 211d associated with each bank, row decoders 212a, 212b, 212c, 212d and peripheral circuit blocks 214, and peripheral pads including I/O pads (213a, 213b) control/address signal pads 215.

Each Bank is further divided into four sub-banks. In particular, the Bank A is divided into 4 sub-banks A1~A4, Bank B is divided into 4 sub-banks B1~B4, Bank C is divided into 4 sub-banks C1~C4 and Bank D is divided into 4 sub-banks D1~D4. The sub-banks for each Bank include two pairs of sub-banks arranged adjacent to each other along rows and separated by corresponding column decoders. For instance, for Bank A, sub-banks pairs A1, A2 and A3, A4 are disposed adjacent to each other along a row and separated by column decoders 211a. For Bank C, sub-banks pairs C1, C2 and C3, C4 are disposed adjacent to each other along a row and separated by column decoders 211c. For Bank B, sub-banks pairs B1, B2 and B3, B4 are disposed adjacent to each other along a row and separated by column decoders 211b. For Bank D, sub-banks pairs D1, D2 and D3, D4 are disposed adjacent to each other along a row and separated by column decoders 211d. Moreover, row decoders 212a/212c are provided between adjacent sub-banks of banks A and C in a row of sub-banks and row decoders 212b/212d are provided between adjacent sub-banks of banks B and D in a row of sub-banks.

Figure 1B:
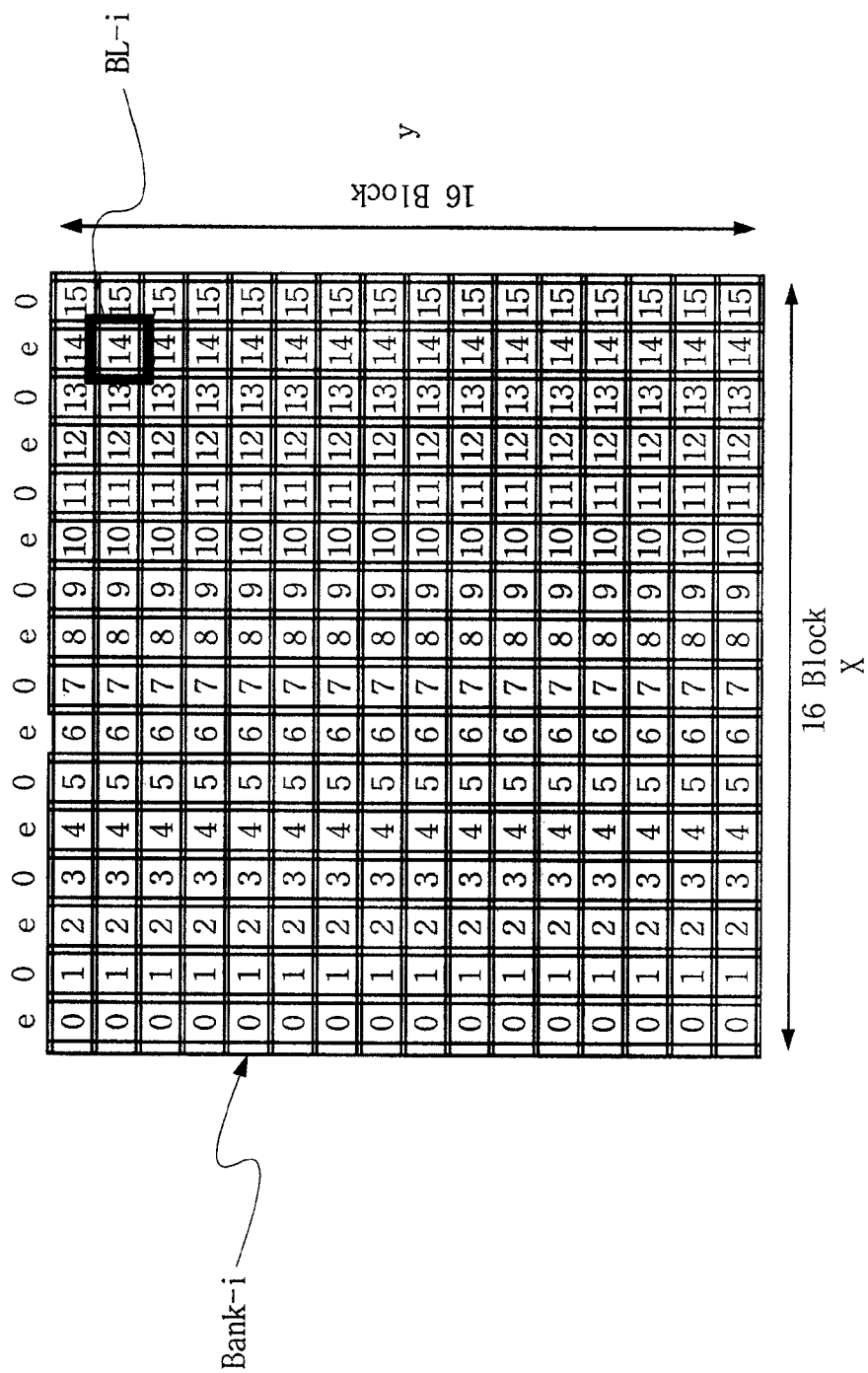
Figure 1C:
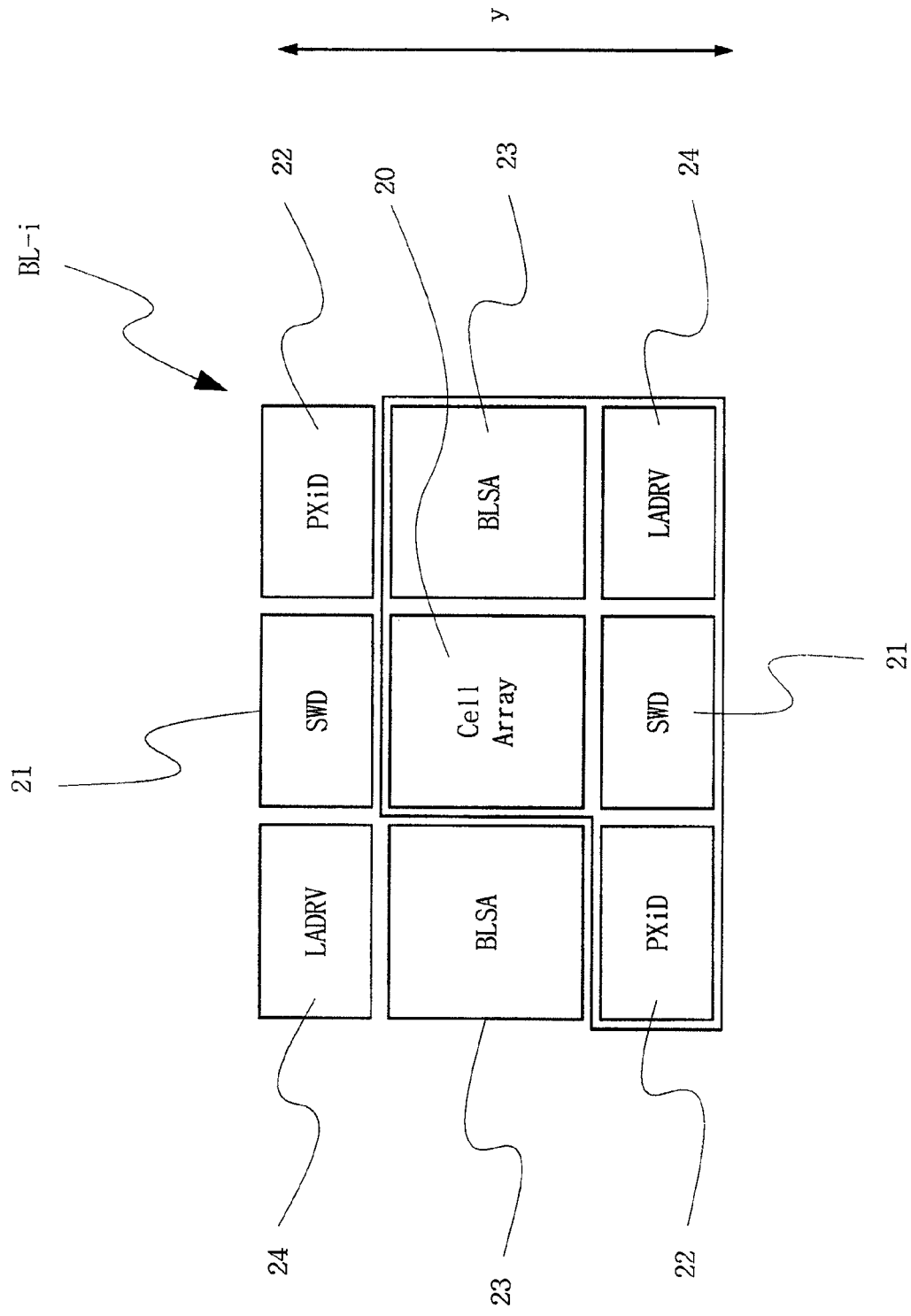
Figure 2:
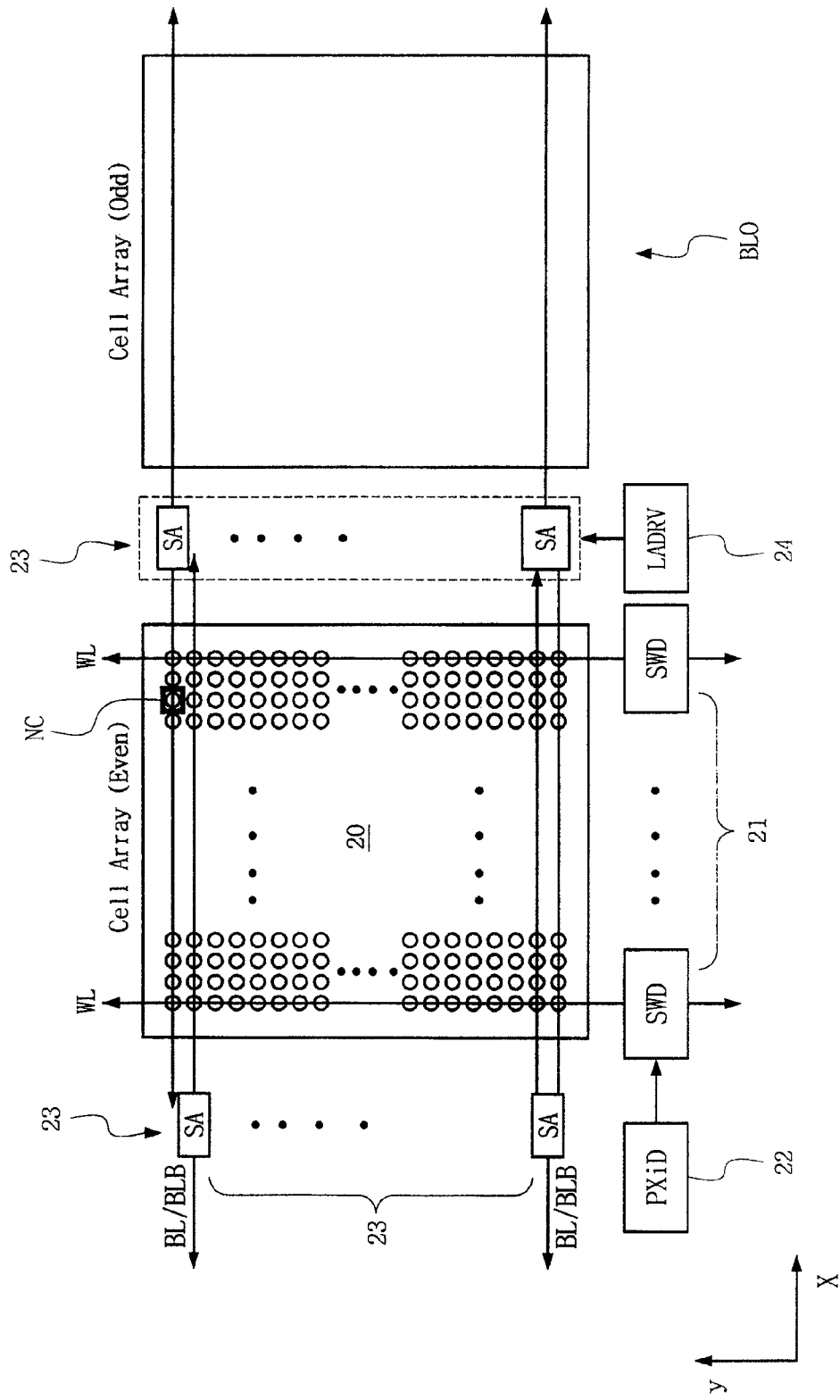
FIG. 2 is a schematic illustration of one conventional framework of a unit block BL-i such as depicted in FIG. 1C in a semiconductor device having a hierarchical divided word line scheme
Figure 3:
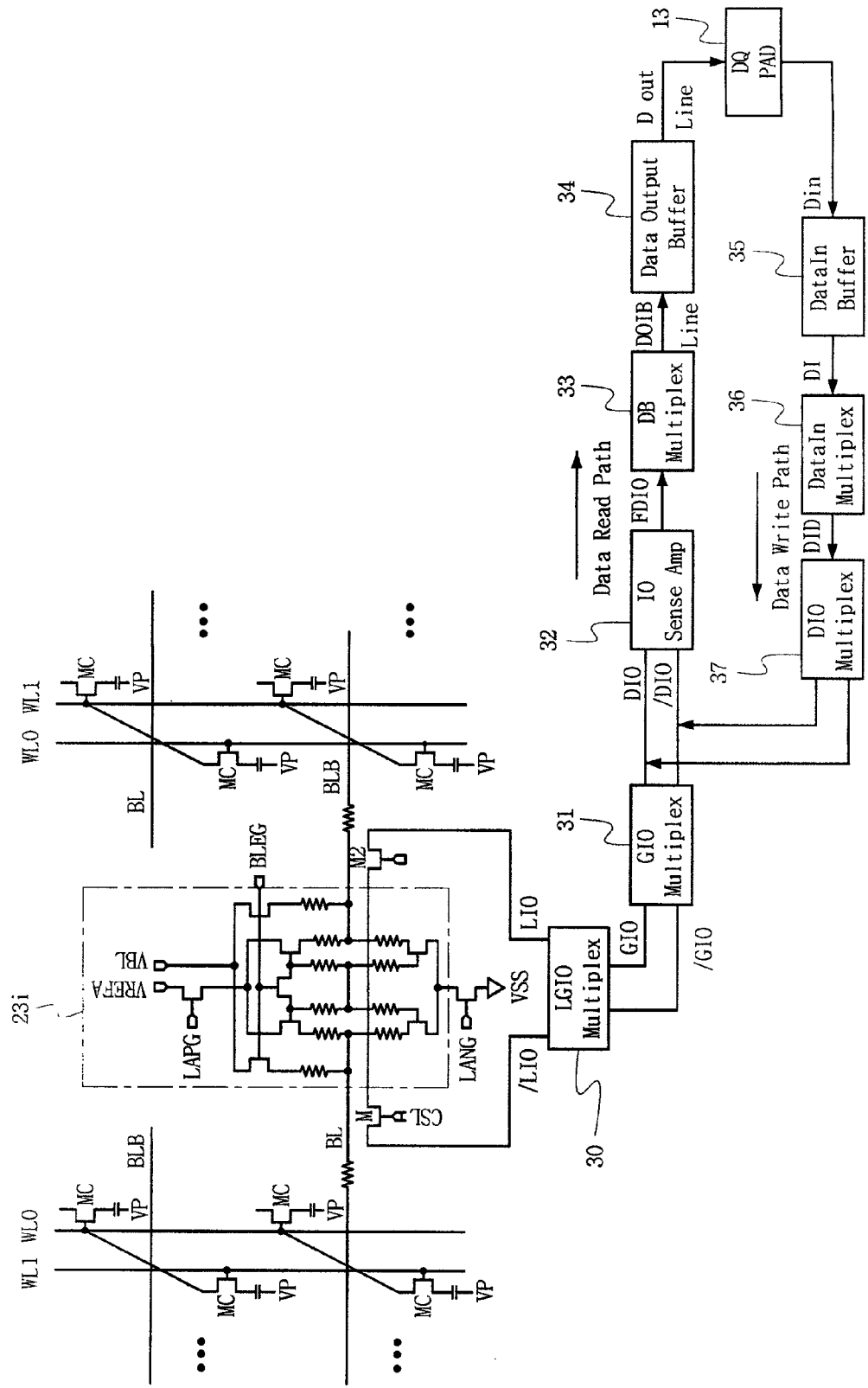
FIG. 3 is a schematic block diagram illustrating I/O circuitry for data read/write data paths for a conventional DRAM core comprising a plurality of banks.
Figure 4:
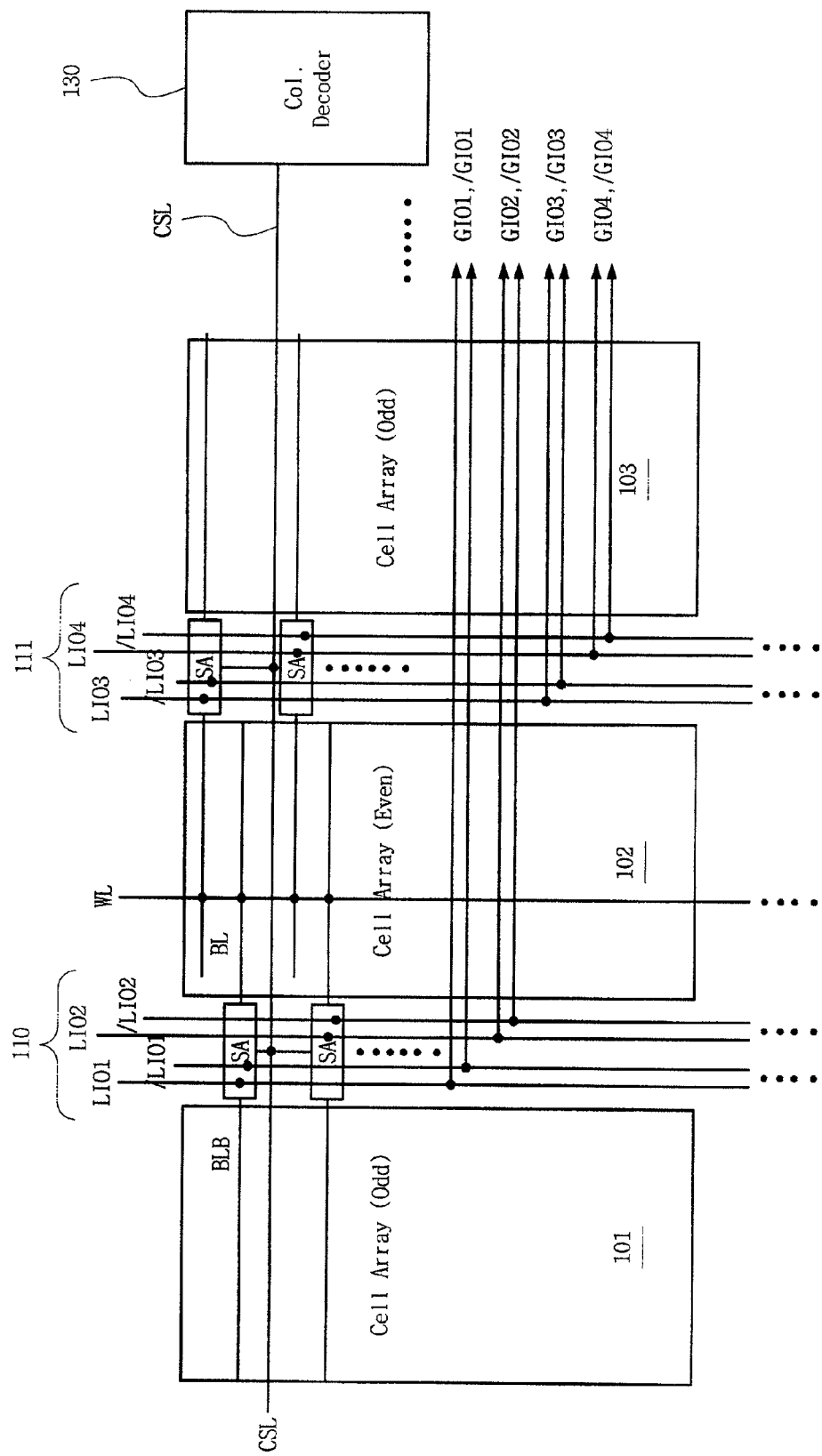
FIG. 4 schematically illustrates a layout arrangement of local and global data I/O bus lines providing a core data path from the memory cells and global bus lines for a multi-bank semiconductor device.

FIG. 6 depicts an exemplary embodiment of the memory device of FIG. 1, wherein each 256 Mb Bank is divided into a plurality of smaller subbanks (e.g., 4 subbanks of 64 Mb) to achieve a more uniform layout. Moreover, an additional I/O bus is formed on the cell arrays utilizing an existing metal layer to shorten the data path. Accordingly, a semiconductor memory device capable of keeping the sensing efficiency of a data line sense amplifier uniform is required a multi-bank integrated circuit memory device is described including four banks, each of which consists of two sub-banks for lower byte data and upper byte data.

Figure 5A:
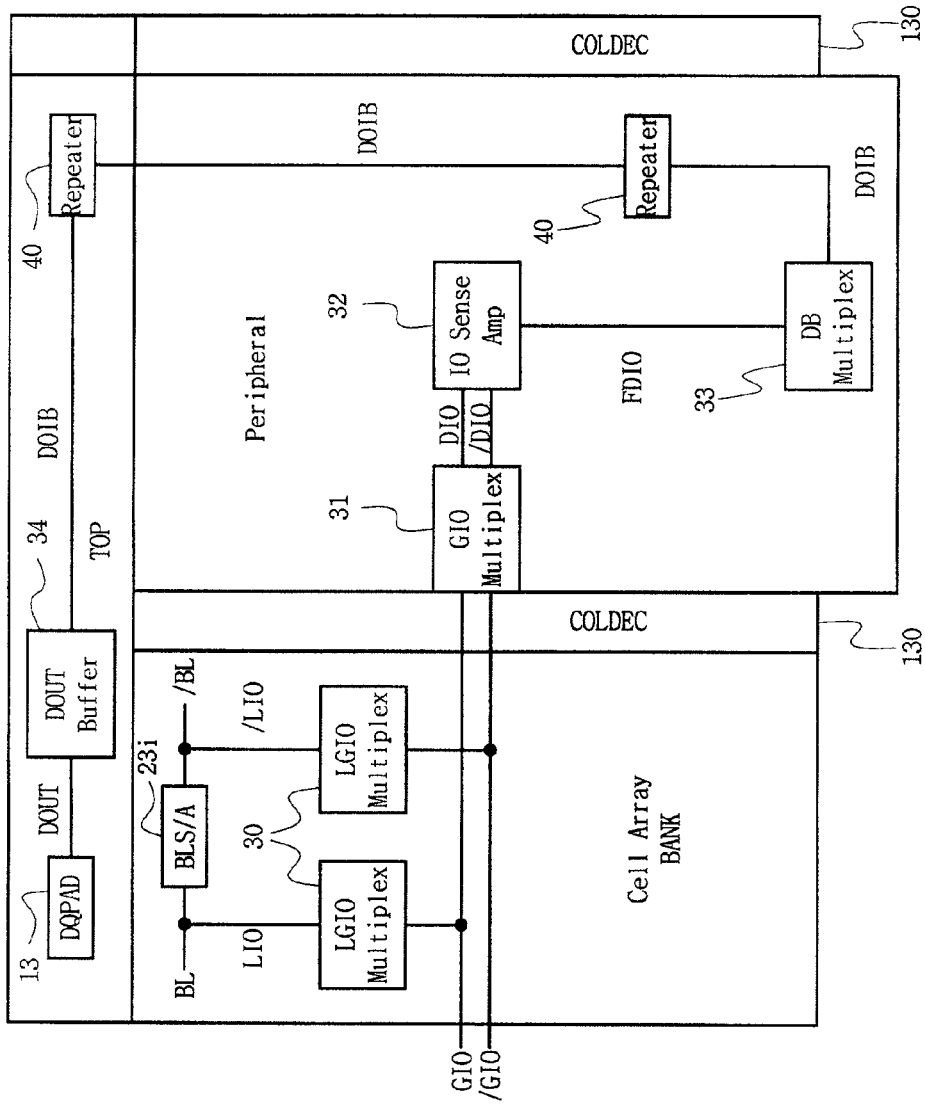
FIG. 5A schematically illustrates a layout of the I/O circuitry and bus lines within the memory cell array regions and in peripheral regions of the memory arrays.
Figure 5B:
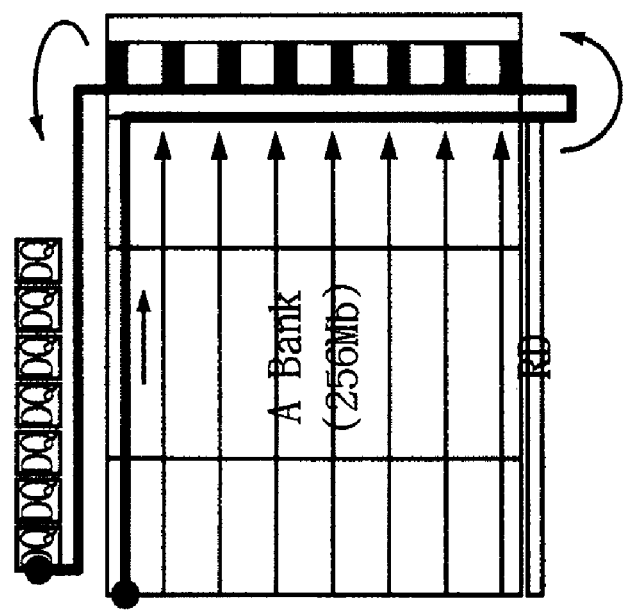
FIG. 5B schematically illustrates a data path for the read operation in the device of FIG. 5A.
Figure 7:
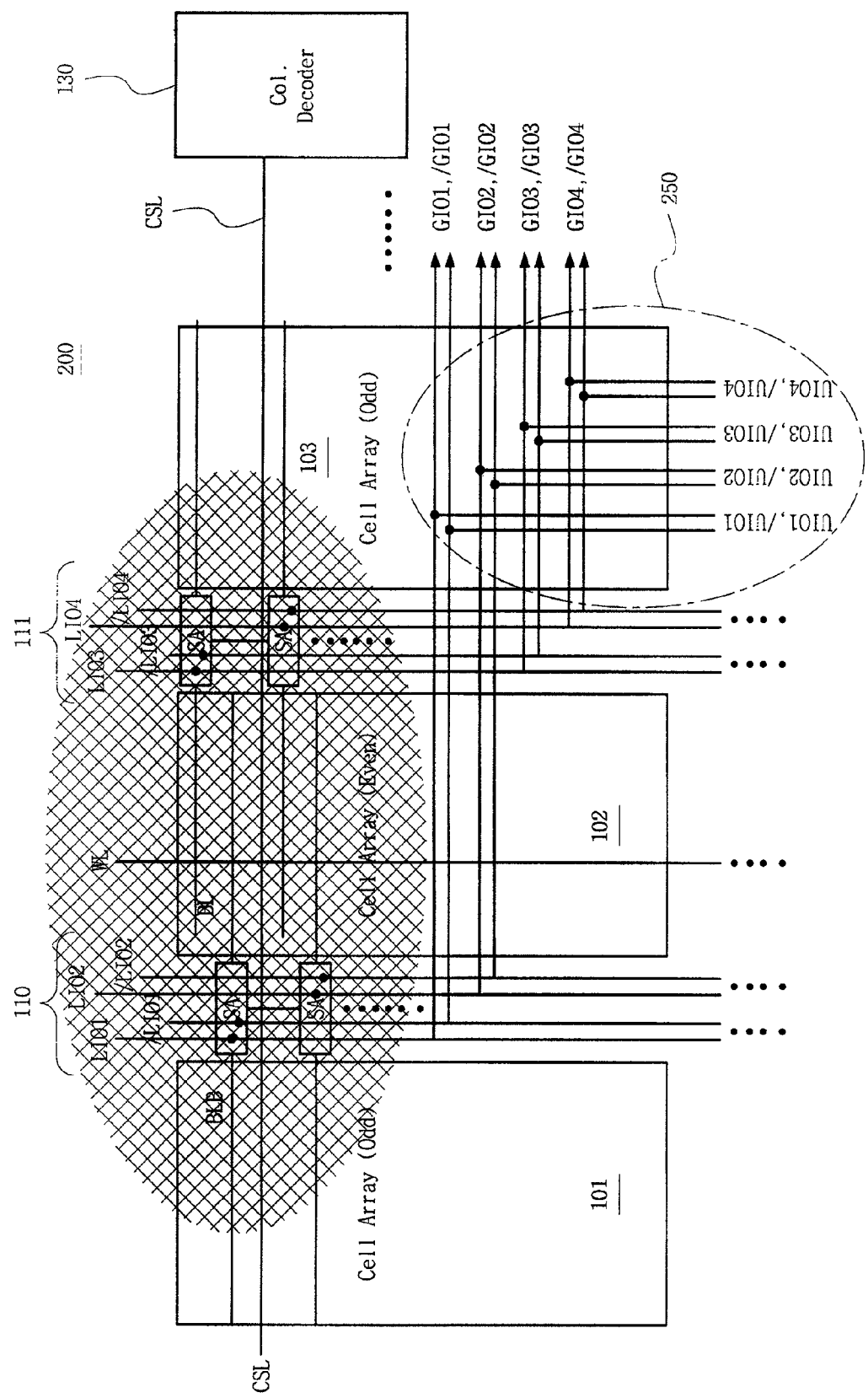
FIG. 7 is an exemplary schematic diagram of a layout pattern of data I/O lines in a semiconductor device according to an exemplary embodiment of the invention.
Figure 8:
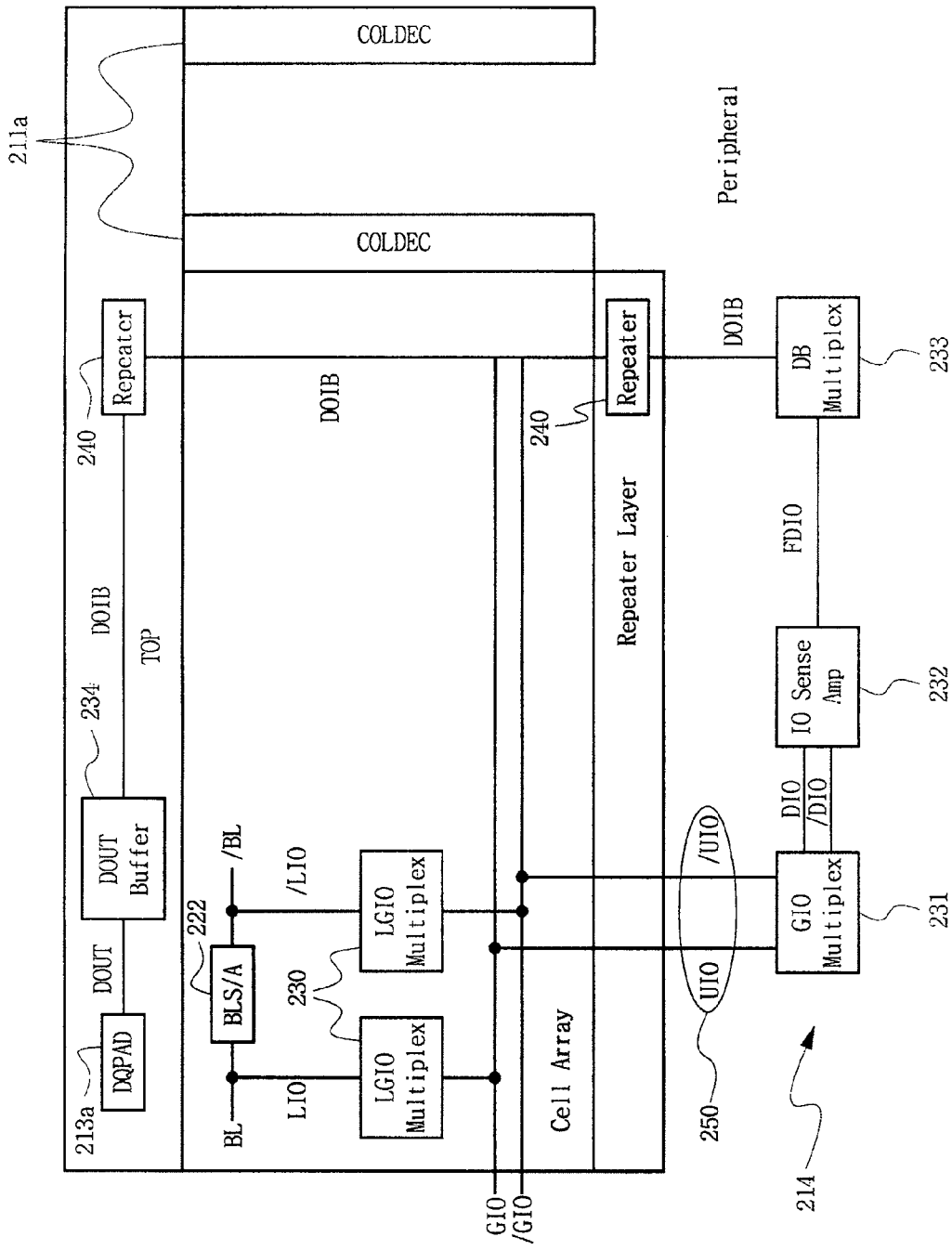
FIG. 8 illustrates an exemplary layout of the I/O circuitry and bus lines of a semiconductor device according to an exemplary embodiment of the invention.

FIG. 7 is an exemplary schematic diagram of a layout pattern of data I/O lines in a semiconductor device (200) according to an exemplary embodiment of the invention. FIG. 7 is similar to FIG. 6 except for the addition of upper I/O data lines UIO (301) having data line pairs that connect to corresponding GIO line pairs, but extend orthogonal to the GIO lines and are formed on a different metal layer than the LIO or GIO lines, but on the same layer as the DIOB lines. The UIO bus lines (250) extends above the memory array perpendicular to the column decoder select lines CSL FIG. 8 illustrates an exemplary layout of the I/O circuitry and bus lines of the semiconductor device (200), which is to be compared with the conventional layout in FIG. 5. The GIO bus lines extends over the entire memory bank towards a peripheral regions between the column decoders (211a) of adjacent subbanks of memory bank A. In FIG. 8, GIO multiplexer circuit (231), I/O sense amplifier circuit (232) and the DB multiplexer circuitry (233) are disposed in the peripheral region between the rows of subbanks. The UIO lines (250) extend from the GIO lines over the cell array to the center peripheral region with I/O circuit (214). Moreover, data I/O bus lines DIOB extend over the cell array to the top regions of the memory banks and then towards the DQ pads (213a) Since the UIO extend over the cell array, the bussing lines in the peripheral region between the column decodes 211 is eliminated, thereby providing an area reduction.

Figure 9:
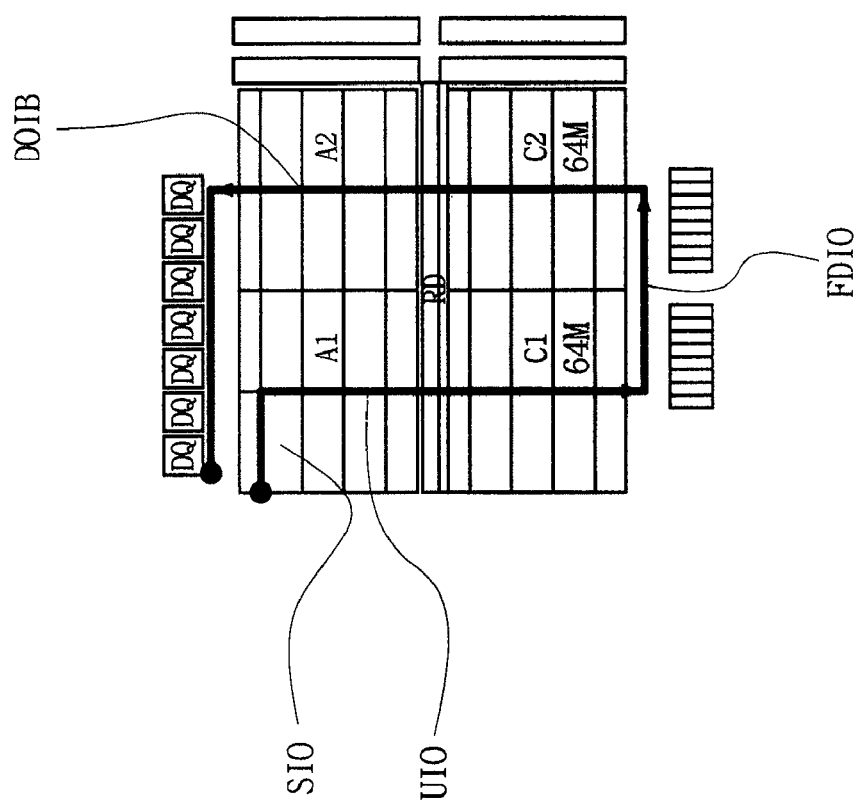
FIG. 9 schematically illustrates a data path for memory access operation a semiconductor device according to an exemplary embodiment of the invention.

FIG. 9 schematically illustrates a data path for memory access operation to the upper left side of the sub memory bank A1 of memory bank (e.g., BANK A), where data that is read from the memory cell travels a short path along the GIO lines toward the column decoder (13) for the bank, and then down the UIO bus lines connected to the GIO line, input to the IO sense amplifiers (232) via the GIO multiplexer (231) and output over the FDIO lines to the DB multiplexer circuit (233) and then transmitted over the cell arrays of subbanks A2 and C2 of, where the data then travels a over a short path DOIB to the output buffer and pads. As compared to the data path of FIG. 5B, a more uniform data path length is achieved in FIG. 9 over all memory cells of the subbanks of a give bank.

Figure 10:
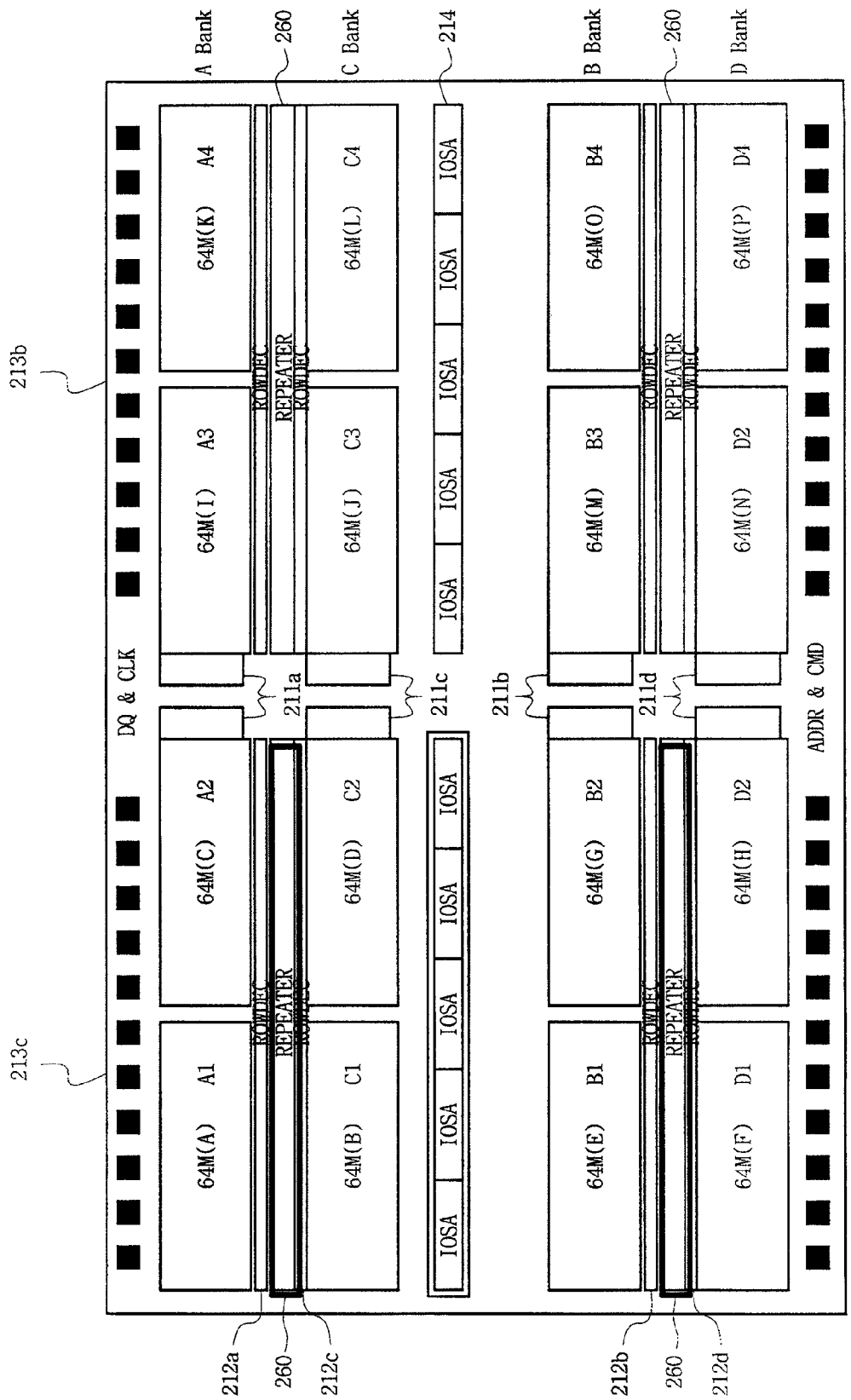
FIG. 10 is an exemplary embodiment of a multibank semiconductor device according to an exemplary embodiment of the invention.

FIG. 10 is another exemplary embodiment of a multiband semiconductor device that is similar in architecture to that of FIG. 6, wherein repeater layers (260) are disposed between the row decoders for adjacent Banks, i.e., between row decoders 212a and 212c for subbanks A and C, and between row decoders 212B and 212D for subanks B and D. The repeater layers (260) include repeaters that can be connected to the DOIB bus lines or other buss lines that extend up and down over the rows of subbanks towards respective DQ pads 213a, 213b. With the exemplary layout of FIG. 10, each memory bank A~D shares the IOSA (214) in the center peripheral region. In particular, the subbanks of each Bank along a given column share the same IO sense amplifiers (e.g., A1, C1, B1, D1) thereby resulting in a decrease in the amount of IOSA by half as compared to the conventional memory device of FIG. 1, for example.

FIG. 11 schematically illustrates a method for performing a x32 DDR memory access with the multibank memory device of FIG. 6. In this method, a total of 64 bits can be selected by activating all 32 I/O in Bank A, for example. In one clock cycle two Wordlines are activated and 4 columns select signals are activated. Since the column decoders 211a separately control adjacent subbanks, A1, A2 and A3, it is easier to control the access and I/O for the upper and lower DQ bits. Each CSL activate 4 sense amplifiers and thus selects 4 memory cells for a given WL activation. In this regard, 32 bits (4 cells×4 CSL×2 subbank) per one WL are selected. For example, subanks A1 and A3 can be activated on a first WL to access 32 bits for upper and lower DQs while subbanks A2 and A4 can be subsequent activated in the same clock cycle to access another 32 bits for upper and lower DQs.

While the present invention has been particularly shown and described with reference to exemplary embodiments thereof, it will be understood by those skilled in the art that various changes in form and details may be made therein without departing from the spirit and scope of the invention as defined by the appended claims.

We claim:

1. A semiconductor memory device, comprising:
  a memory array comprising a plurality of memory banks, wherein each bank is divided into a plurality of sub-banks;
  a first set of data I/O lines extending in a first direction between sub-banks, wherein the first set of data I/O lines are formed in a first metallization level;
  a second set of data I/O lines extending in a second direction, perpendicular to the first direction, across one sub-bank, wherein the second set of data I/O lines are formed in a second metallization level and connected to the first set of data I/O lines; and
  a third set of data I/O lines extending in the first direction across the one sub-bank, wherein the third set of data I/O lines are formed in a third metallization level and connected to the second set of data I/O lines.

2. The semiconductor memory device of claim 1, wherein the groups of data I/O lines are connected to I/O sense amplifiers disposed in regions of the memory array between adjacent banks.

3. The semiconductor memory device of claim 1, wherein the memory device comprises a DRAM with edge pad topology.

4. The semiconductor memory device of claim 1, wherein each subbank of a given memory Bank is arranged along a row in the first direction.

5. The semiconductor memory device of claim 4, wherein at least two banks have rows of subbanks that are adjacent to each other with word line decode circuitry interposed there between.

6. The semiconductor memory device of claim 5, wherein at least two subbanks of a given bank share a same column decoder for the bank.

7. The semiconductor memory device of claim 1, wherein the third set of data I/O lines are connected to I/O circuitry disposed in a central region between adjacent pairs of memory banks.

8. The semiconductor memory device of claim 7, further comprising a fourth set of data I/O lines connected to the I/O circuitry and extending in the first direction between the central region across one or more sub-banks toward a peripheral edge region and connected to I/O pads disposed on the peripheral edge region.

9. The semiconductor memory device of claim 8, wherein the fourth set of data I/O lines are formed in the third metallization level.

10. A multi-bank integrated circuit memory device comprising a plurality of independently controlled memory banks, wherein each memory bank is divided into a plurality of sub-banks arranged in a plurality of rows and columns of sub-banks of memory cells, wherein the sub-banks of each bank being located along the same row of sub-banks of memory cells;
  wherein at least two banks have rows of subbanks that are adjacent to each other with word line decode circuitry interposed there between.

11. The multi-bank integrated circuit memory device of claim 10, wherein each column of subbanks of memory cells includes one subbank of each memory bank.

12. The multi-bank integrated circuit memory device of claim 11, wherein each column of subbanks of memory cells includes one subbank of each memory bank which commonly share I/O sense amplifier circuitry.

13. The multi-bank integrated circuit memory device of claim 10, wherein each bank has separate column decode circuit blocks that control different subbanks for the bank.

14. A multi-bank integrated circuit memory device comprising a plurality of independently controlled memory banks, wherein each memory bank is divided into a plurality of sub-banks arranged in a plurality of rows and columns of sub-banks of memory cells, wherein the sub-banks of each bank being located along the same row of sub-banks of memory cells,
  wherein the multi-bank integrated circuit memory device further comprising:
    a first set of data I/O lines extending in a first direction between sub-banks, wherein the first set of data I/O lines are formed in a first metallization level;
    a second set of data I/O lines extending in a second direction, perpendicular to the first direction, across one sub-bank, wherein the second set of data I/O lines are formed in a second metallization level and connected to the first set of data I/O lines; and
    a third set of data I/O lines extending in the first direction across the one sub-bank, wherein the third set of data I/O lines are formed in a third metallization level and connected to the second set of data I/O lines.

15. The multi-bank integrated circuit memory device of claim 14, wherein the third set of data I/O lines are connected to I/O circuitry disposed in a central region between adjacent pairs of memory banks.

16. The multi-bank integrated circuit memory device of claim 15 further comprising a fourth set of data I/O lines connected to the I/O circuitry and extending in the first direction between the central region across one or more sub-banks toward a peripheral edge region and connected to I/O pads disposed on the peripheral edge region.

17. The multi-bank integrated circuit memory device of claim 16 wherein the fourth set of data I/O lines are formed in the third metallization level.

* * * * *